United States Patent [19]

Kawano et al.

[11] Patent Number: 4,833,519

[45] Date of Patent: May 23, 1989

[54] SEMICONDUCTOR DEVICE WITH A WIRING LAYER HAVING GOOD STEP COVERAGE FOR CONTACT HOLES

[75] Inventors: Michiari Kawano; Masayuki Higashimoto, both of Kawasaki; Shigeo Kashiwagi; Jun Nakano; Osamu Shimizu, all of Yokohama, Japan

[73] Assignee: Fujitsu Limited, Kanagawa, Japan

[21] Appl. No.: 49,917

[22] Filed: May 15, 1987

[30] Foreign Application Priority Data

| May 30, 1986 | [JP] | Japan | 61-124816 |
| May 30, 1986 | [JP] | Japan | 61-124812 |
| May 30, 1986 | [JP] | Japan | 61-124814 |
| May 30, 1986 | [JP] | Japan | 61-124815 |

[51] Int. Cl.$^4$ .................. H01L 21/28; H01L 23/48
[52] U.S. Cl. ............................ 357/59; 357/71; 357/49; 357/67; 437/190; 437/193; 437/195; 437/200
[58] Field of Search ............... 357/71, 59, 67, 49; 437/190, 193, 195, 200

[56] References Cited

U.S. PATENT DOCUMENTS

| 3,771,026 | 11/1973 | Asai et al. | 357/59 |
| 4,329,706 | 5/1982 | Crowder et al. | 357/71 |
| 4,526,631 | 7/1985 | Silvestri et al. | 437/238 |
| 4,624,864 | 11/1986 | Hartmann | 437/193 |
| 4,661,832 | 4/1987 | Lechaton et al. | 357/49 |
| 4,715,109 | 12/1987 | Bridges | 437/200 |

FOREIGN PATENT DOCUMENTS

| 0100897 | 2/1984 | European Pat. Off. | 357/71 |
| 0170544 | 2/1986 | European Pat. Off. | 357/71 |

Primary Examiner—Andrew J. James
Assistant Examiner—Jerome Jackson, Jr.
Attorney, Agent, or Firm—Armstrong, Nikaido Marmelstein & Kubovcik

[57] ABSTRACT

A method and apparatus are disclosed for improving step coverage of a wiring layer of a semiconductor device especially at the contact holes thereof. The inside of the contact holes are covered by a polysilicon layer deposited by chemical vapor deposition (CVD), and selectively doped with impurities having the same conductivity type as the contact region which the polysilicon layer contacts at the bottom of the contact hole. The remaining part of the contact hole is buried with SiO$_2$, and the wiring layer is formed on it. Since the step coverage of the material deposited by CVD is very good, the disconnection at the side walls of the contact hole is avoided. Further, short circuits caused by growth of spikes of eutectic of silicon and aluminum is also avoided. If the surface of the polysilicon layer is covered with a thin film of SiO$_2$ or Si$_3$N$_4$, the material to bury the contact hole may be replaced by other materials such as polysilicon or amorphous silicon. Further, a barrier layer may be provided between the wiring layer and the polysilicon layer. This prevents the migration of aluminum over the polysilicon, so that the reliability of the wiring is further improved. The barrier layer is made from a silicide of high melting point metal or the metal itself. This improves the conduction between the contact region and the wiring layer.

8 Claims, 8 Drawing Sheets

SEMICONDUCTOR DEVICE WITH A WIRING LAYER HAVING GOOD STEP COVERAGE FOR CONTACT HOLES

BACKGROUND OF THE INVENTION

The present invention relates to the configuration of a semiconductor device to improve the reliability of the interconnection wiring formed on the surface of the device. In particular, the present invention relates to the configuration of a wiring layer to provide good step coverage for contact holes formed in an insulation layer through which the wiring layer contacts the device electrodes.

In recent semiconductor devices, especially in integrated circuits (ICs), the dimension of the devices fabricated on a chip has become very small, however the insulation layer covering the surface of the device cannot be made as thin. Thus, the openings of contact holes formed in the insulation layer through which the wiring layer contacts to the electrodes of the devices is very small. The small openings increases the difficulty of making contact between the wiring layer formed on the surface of the insulation layer with the electrode positioned on the bottom of the contact holes. The wiring layer must cover the side walls of the contact holes of the insulator, but this becomes difficult when the opening of the contact hole becomes comparative in size to the depth of the contact hole.

To cover a side wall of a stepped portion with wiring material is called in the art, step covering or step coverage. Usually aluminum is sputtered to form the wiring layer over the insulated surface of the device The step coverage of sputtered aluminum is poor, so the wiring pattern often breaks and causes disconnection at the stepped portion on the surface of the device on which the wiring layer is formed thus causing malfunctioning of the device. In order to overcome this problem, the sputtering is done from various directions so that the side wall of the stepped portion is covered by the wiring material.

As mentioned before, when the device size decreases, and the opening of the contact hole becomes comparative to the depth of the hole, the side sputtering becomes ineffective. Such situations are shown in FIG. 1, which schematically illustrates the cross section of a device at a portion close to a contact hole. In the figure, an n type silicon substrate 31 and an n+ type contact region 32 are to be contacted by the wiring layer. 32 may be a contact region for the device (not shown completely), and 33 is a surface coating insulation layer such as a silicon dioxide (SiO$_2$) layer for example. A contact hole 35 is formed in the insulation layer 33 through which the wiring layer 34 contacts with the contact region 32. The wiring layer 34 is composed of aluminum sputtered on the insulation layer 33. The sputtering is done vertically and also from slanted directions in the figure. However, as can be seen, the thickness of the aluminum layer on the side walls of the contact wall is thin at the side walls of the contact hole 35. Namely, the step coverage of sputtered aluminum is poor, and it often causes disconnection of the wiring layer.

There is another problem in the aluminum wiring layer. Aluminum is likely to form an eutectic alloy with silicon, and it forms spikes which penetrate through the contact region 32 and causes a short circuit between the wiring layer 34 and the substrate 31. Several solutions have been proposed to overcome such problems.

One proposal is to provide a thin layer (approximately 500 Å) of polycrystalline silicon (not shown) between the aluminum layer 34 and the n+ contact region 32. In this method, the resistivity of the silicon layer can not be substantially reduced, so recently an alloy of aluminum and silicon, tungsten or titanium is sputtered. This method is disclosed in, for example, French Pat. No. 8409313 by Joel Alman, June 14, 1984 (the same application has been published as Japanese Laid Open Pat. No. 61-10256, Jan. 17, 1986). But in this method, the problem of step coverage of the sputtered material still remains.

Another proposal is to bury the contact holes with conductive material such as polysilicon (polycrystalline silicon). In this case, the polysilicon must be doped with p or n type materials in accordance with the conductivity type of the contact regions beneath the polysilicon in order to make a good ohmic contact. If the conductivity type of the contact regions in the chip all have the same conductivity type, the doping can be done in a process to grow the polysilicon layer (chemical vapor deposition for example) But usually, the chip contains both p and n type contact regions, so the doping must be done selectively in accordance with the conductivity type of the contact regions beneath the polysilicon. Such selective doping must be done by diffusion process from the surface of the grown polysilicon layer. However, the conductivity of the diffused layer becomes low as the distance from the surface becomes large. Therefore, the resistivity of the buried material in the contact holes becomes high, and the resistance of the wiring layer increases. Accordingly, though this method has been proposed, its adoption in practical use was very rare.

The conductivity of the wiring layer is of increasing importance for a device which is operated at high speed or for large scale integrated circuits in order to decrease heat dissipation.

SUMMARY OF THE INVENTION

The primary object of the present invention, is to provide a semiconductor device in which the wiring layer has a good step coverage for contact holes.

Another object of the present invention is to increase the reliability of a semiconductor device by preventing disconnection and preventing the formation of a spike through of the wiring layer.

Still another object of the present invention is to provide a structure for a semiconductor device for the foregoing objects.

A further object of the present invention is to provide a fabrication process for realizing the foregoing objects.

According to a first embodiment of the present invention, a polysilicon film is formed in the contact holes formed in the insulation layer through which the wiring layer contacts to the device electrodes. The polysilicon film is formed by chemical vapor deposition (CVD), which deposits the material almost uniformly on the surface regardless of the direction. Therefore, the side walls of the contact holes are covered with a polysilicon film having almost the same thickness as that grown on the top surface of the insulation layer. The polysilicon film at the portion of the contact holes is selectively doped by ion implantation to have the same conductivity as that of respective contact regions. This doped polysilicon film provides a first conductive layer having good step coverage for the contact holes.

The portions of the first conductive layer positioned in each contact hole are buried with a thick layer of silicon dioxide (SiO$_2$), so the surface of the device becomes flat. The wiring layer is formed over the flat surface. Thus, the problems of step coverage and spikes of eutectic material are avoided, and a good ohmic contact is secured.

As a variation of the first embodiment, the thick silicon dioxide layer is replaced by a thin silicon dioxide layer, and the remaining part of the contact hole is buried with other materials, such as polysilicon, or amorphous silicon etc. In any case, the polysilicon film is covered with a silicon dioxide film. The reason will be discussed in the following detailed description of the invention.

According to the second embodiment of the invention, a barrier layer made from a silicide of metal having a high melting point (WSi$_2$ for example) is added on the surface of the polysilicon film described in the first embodiment. This barrier layer prevents the disconnection or decrease of the conductivity of the wiring layer caused by the migration of metal (especially aluminum) on the silicon. The barrier layer is also formed by CVD, so its step coverage is good, and it provides second conductive layer to connect the contact region and the wiring layer. Thus, the contact resistance is further decreased.

According to the third embodiment, the barrier layer is formed by a metal having a high melting point, tungsten, molybdenum, or platinum, etc. As a modification of the third embodiment, the metal layer is heat treated to form a silicide barrier layer. These and other modifications and advantage of the invention will be described in detail in the following description of the preferred embodiments.

DESCRIPTION OF PREFERRED EMBODIMENTS

Now, the advantage of the present invention will be described referring to preferred embodiments. FIG. 2 illustrates fundamental steps of the fabrication process to realize a first embodiment of the present invention. In the disclosure hereinafter a substrate of n type silicon is used as an example. But it will be apparent that the substrate may be replaced by one having another type of conductivity. In the description hereinafter the steps of the process will be denoted by the same number of the figures. For example, the process described with respect to FIG. 2(a) will be denoted as the process 2(a).

Figure 2A:
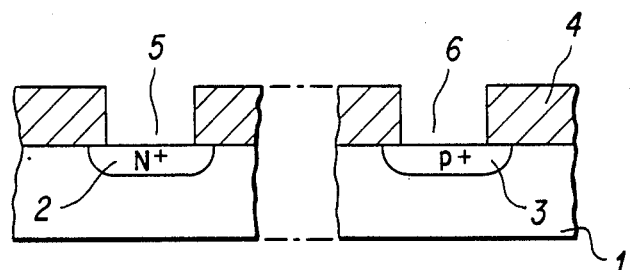
FIGS. 2(a) to 2(f) show a cross section of a portion of device close to contact holes illustrating the steps for fabricating a wiring layer of the first embodiment of the present invention.

As shown in FIG. 2(a), the surface of an n type silicon substrate 1 is covered with an insulation layer 4 which may be a silicon dioxide layer of 1 $\mu$m thick for example. Contact holes 5 and 6 are formed over the n$^+$ and p$^+$ type contact regions 2 and 3. These contact regions may be electrodes of the device (not shown) fabricated in the substrate 1, and are fabricated by ordinary semiconductor device fabrication technology of diffusion and photolithography etc.

Figure 2B:
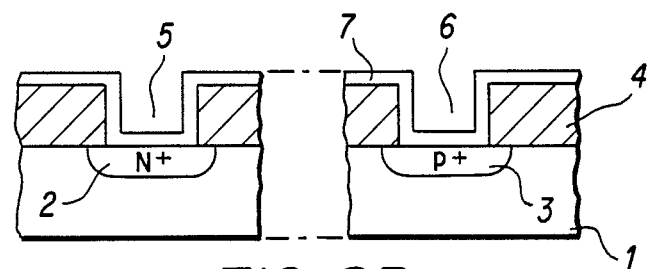

Next, as shown in FIG. 2(b), a polysilicon layer 7, approximately 2,000 Å thick is deposited over the entire surface of the substrate. The thickness of the polysilicon layer 7 may be approximately 1,000–3,000 Å for example. As mentioned before, the CVD process deposits a material uniformly over the surface regardless of its inclination. Thus, the deposited polysilicon layer has an almost equal thickness at the side walls and at the top surface of the device. Namely, the step coverage is very good.

Figure 2C:
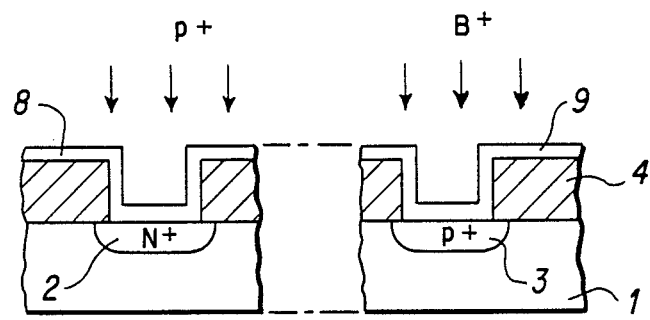

Subsequently, as shown in FIG. 2(c), the polysilicon layer at the portion of contact holes 5 and 6, is selectively doped with n type or p type impurities by ion implantation corresponding to the conductivity type of the contact region which the polysilicon layer contacts, and respectively converted to n type and p type polysilicon layers 8 and 9. They provide good ohmic contact respectively to the n or p type contact regions 2 or 3. The ion implantation for n type impurity is done using phosphorus ions (P$^+$) with dosage of more than 10$^{15}$/cm$^2$ with an acceleration energy of 50 keV for example, and the ion implantation for p type impurity is done using boron ions (B$^+$) with almost the same doping conditions. The doped area may extend over the top surface of the substrate around the contact hole. Therefore, the area of the selective ion implantation is not so critical. The wider area provides better contact to the wiring layer which is fabricated over the polysilicon layer by the following steps. The above described fabrication processes are all conventional ones, and they must be varied in accordance with the device to be fabricated. But they are not relevant to the invention, so, further description is omitted for the sake of simplicity.

Figure 2D:
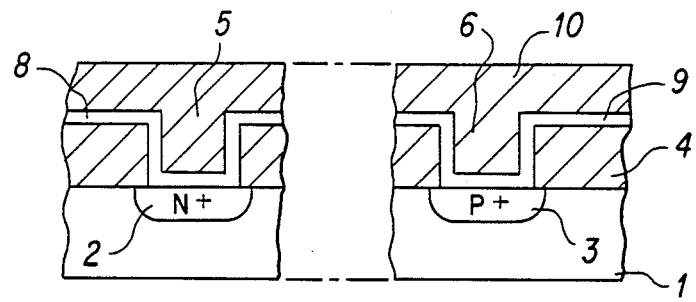

Next, as shown in FIG. 2(d), on the surface of the substrate is deposited a thin SiO$_2$ layer 10 by CVD. The thickness of the SiO$_2$ layer is sufficient to bury the contact holes 5 and 6.

Figure 2E:
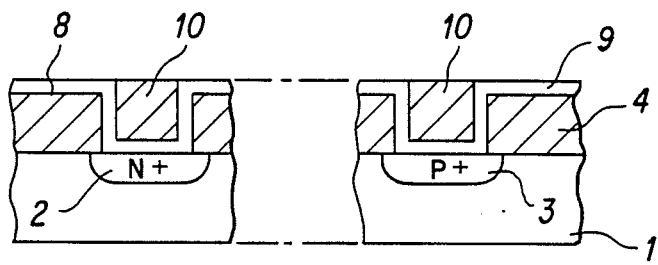

Then as shown in FIG. 2(e), the SiO$_2$ layer 10 is etched back to expose the surface of the n and p type polysilicon layers 8 and 9. Conventional dry etching is applicable for this step. The etching rate of SiO$_2$ and polysilicon are different from each other, so it is possible to stop the etching when the SiO$_2$ layer 10 is removed from the polysilicon layers 8 or 9. By this process, the contact holes are buried perfectly by the SiO₂ 10, and the surface of the device becomes flat as shown in the figure.

Figure 2F:
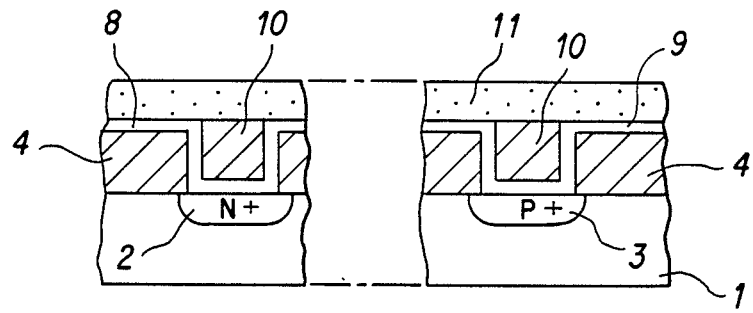

Succeedingly, as shown in FIG. 2(f), a wiring layer 11 is formed over the flat surface of the device. The wiring layer may be fabricated with any kind of material, but aluminum is most popular in the art. The aluminum is sputtered by a conventional method, and the aluminum layer 11 is patterned by conventional photolithography to a predetermined pattern to interconnect the electrodes. The surface of the device is then passivated in a conventional manner and the device is finished.

As can be seen in FIG. 2(f), the n and p type contact regions 2 and 3 are connected to the wiring layer 11 by n and p type polysilicon films 8 or 9. The step coverage of the polysilicon films 8 and 9 is very good, so disconnection at the side walls of the contact holes does not occur. Moreover, the surface of the contact regions 2 and 3 are not directly contacted by aluminum, and thus a short circuit caused by growth of the spikes formed by eutectic of aluminum and silicon has been avoided.

The above disclosed process for fabricating the first embodiment of the present invention is a fundamental process. But it is possible to make several modifications each having further improvement or advantage over the first embodiment.

FIG. 3 illustrates first modification of the production steps of the first embodiment, wherein a silicon dioxide film 21 is added to cover the surface of the polysilicon film 9. This modification is proposed to make it easy to determine the end point of the etching back process of FIG. 2(e). The process of FIGS. 2(a) through 2(c) are the same as those of the first embodiment. Following the process 2(c) of FIG. 2, as shown in FIG. 3(a), a thin SiO₂ layer 21 of approximately 500 Å is formed over the entire surface of the device. Thermal oxidation is preferable for this step. Then the thick polysilicon layer 22 is formed over the entire surface of the device to bury the contact holes as shown in FIG. 3(b). The thick polysilicon layer 22 is then etched back by conventional dry etching. Since the etching rate of the polysilicon is much greater than that of silicon dioxide, it is easy to stop the etching back process correctly at the level of the surface of the thin SiO₂ film 21 as shown in FIG. 3(c). After etching off the exposed thin SiO₂ film 21, the process of FIG. 2(d) is followed. The final cross section of the device thus becomes that shown in FIG. 3(d). In FIG. 3(d), the surface of the polysilicon layer 22 is shown protruding upward from the level of the polysilicon layer 8 or 9, to emphasize the thickness of the etched SiO₂ layer 21. But as has been described above, the thickness of the SiO₂ 21 is only 500 Å, moreover, the polysilicon layer 22 is also etched to some extent by the etchant for the SiO₂. Therefore, the top surface of the polysilicon layer 22 is substantially equal to the top surface of the polysilicon layer 8 or 9.

Compared to the device fabricated by the first modification to the first embodiment, the material burying contact holes 22 is replaced by polysilicon, but the effect is the same. It should be pointed out that by adding the thin SiO₂ film 21, it becomes possible to replace the material to bury the contact holes with any other material, uuch as amorphous silicon for example, and the control of the etching back process becomes easier. It will be understood by one in the art that the thin SiO₂ layer 21 in the process 3(a) may be replaced by some other insulator layer, such as silicon nitride (Si₃N₄) for example.

Figure 1:
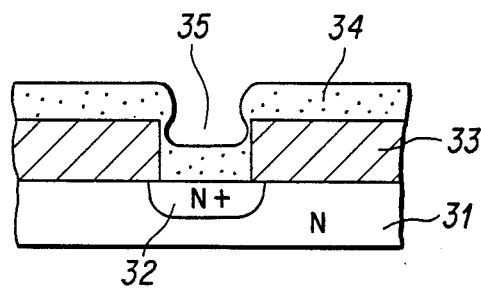
FIG. 1 shows schematically a cross section of a device at a portion close to a contact hole illustrating poor step coverage of a wiring layer formed by the prior art.
Figure 4:
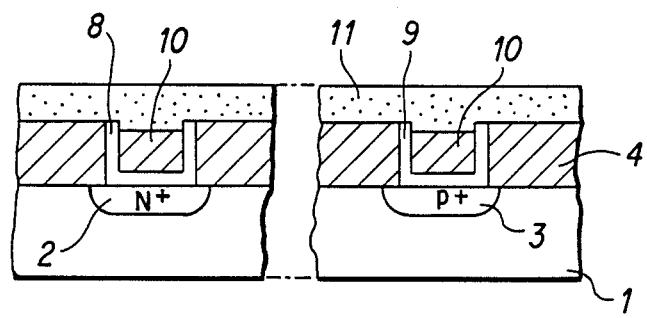
FIG. 4 shows second modification of the first embodiment illustrating a cross section of the contact holes corresponding to that of FIG. 2(f).

FIG. 4 shows a second modification of the first embodiment illustrating a cross section of the contact holes corresponding to that of FIG. 2(f), wherein the level of the silicon dioxide layer 10 has been slightly withdrawn or recessed from the level of the SiO₂ layer 4. This modification is effective when the polysilicon layers 8 and 9 extending over the top surface of the device are removed in order to reduce the contact area to increase the packing density of the devices in the IC. This modification is possible by slightly over etching the SiO₂ layer 10 at the process of FIG. 2(e). The small over etching does not cause any problem in step covering. It is clear that the configuration of FIG. 4 provides a wider contact area between the polysilicon layers 8 and 9 and the wiring layer 11. In FIG. 4, the thickness of the polysilicon layers 8 and 9 is approximately 2,000 Å corresponding to FIG. 2(d). Therefore, the contact area between the polysilicon layers 8 or 9 and the wiring layer 11 is very small. But as can be seen in FIG. 4, when the level of the SiO₂ layer 10 is slightly withdrawn, the side walls of the polysilicon layers 8 and 9 can also be used as the contact area with the wiring layer 11, so the contact area is increased by such over etching and the contact resistance is reduced.

Coming back to FIG. 2(f) that shows a cross section of the first embodiment, the contact area between the wiring layer 11 and the polysilicon films 8 or 9 is very wide, therefore, tee problem of the contact resistance does not occur. However, if aluminum contacts the polysilicon for a long period of time, and if the device is heated or voltage is applied between the wiring layer and the substrate, the aluminum migrates over the surface of the polysilicon, and in a long time period, the conductivity of the wiring layer decreases.

Figure 5:
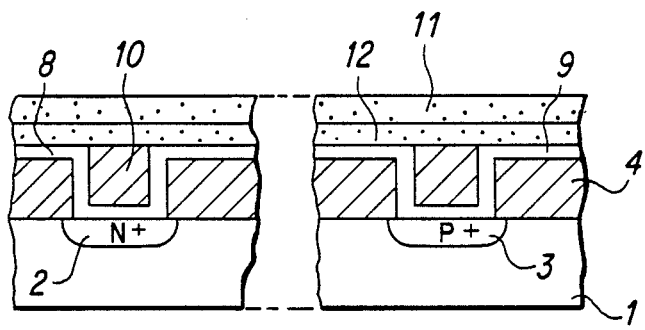
FIG. 5 shows a cross section of a portion of a device close to the contact holes illustrating a second embodiment of the present invention, wherein a barrier layer is added to prevent the migration of wiring metal.

The second embodiment of the present invention intends to overcome the problem of migration of metals on the polysilicon. The migration is avoided by adding a barrier layer between the polysilicon and the metal layer. FIG. 5 illustrates a cross sectional view close to the contact holes of the second embodiment. The figure corresponds to FIG. 2(f). Compared to FIG. 2(f), the second embodiment of FIG. 5 has barrier layer 12 added. The barrier layer 12 is composed of silicide of high melting point metal such as tungsten, molybdenum or platinum. The barrier layer forms a second conductive layer between the wiring layer 11 and the first conductive layer composed of the polysilicon layers 8 and 9.

The material of barrier layer 12 is deposited by CVD or sputtering. It will be understood for the one skilled in the art, that the deposition of the barrier layer can be done between the steps of 2(e) and 2(f) described with respect to FIG. 2. In an example, tungsten silicide (WSi₂) film of approximately 1,000 Å was deposited by CVD. The barrier layer 12 avoids the migration of the metal. Several modifications are possible for the second embodiment described with respect to FIG. 5.

Figure 6:
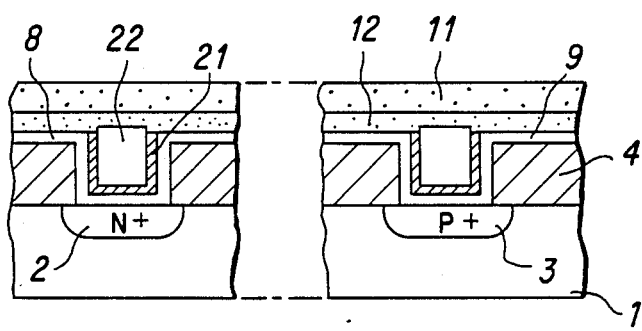
FIG. 6 shows a variation of the second embodiment, wherein the material burying the contact holes is replaced by a thin layer of silicon dioxide and polysilicon or amorphous silicon.

FIG. 6 shows first modification of the second embodiment. It will be clear to one in the art that the barrier layer 12 is added to the device shown in FIG. 3(d). Therefore, the deposition of the barrier layer 12 should be done between the steps of 3(c) and 3(d) described with respect to FIG. 3. The effect of preventing the migration of aluminum is thus further added to the device of FIG. 3(d).

In the above disclosure, the barrier layer 12 is composed of a silicide of high melting point metals. But it is possible to avoid the migration of metals by other methods. In the third embodiment of the present invention, the barrier layer is formed by a high melting point metal layer.

FIG. 7 shows the steps to form the barrier layer composed from metal layer of high melting point metals such as tungsten, molybdenum or platinum. Such materials will be denoted as barrier metals hereinafter. The process begins following step 2(c) described with respect to FIG. 2.

Figure 7A:
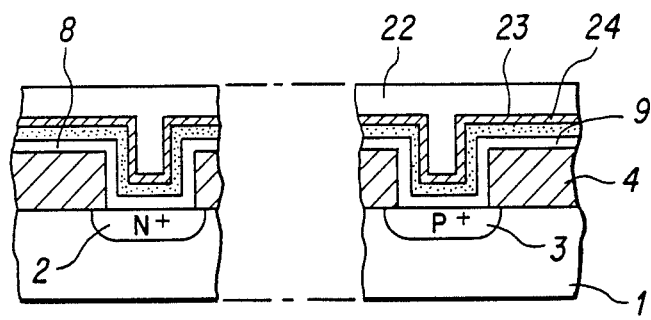
FIGS. 7(a) to 7(c) illustrate the fabrication steps for a third embodiment, wherein the barrier layer is formed by a layer of metal having a high melting temperature.
Figure 7B:
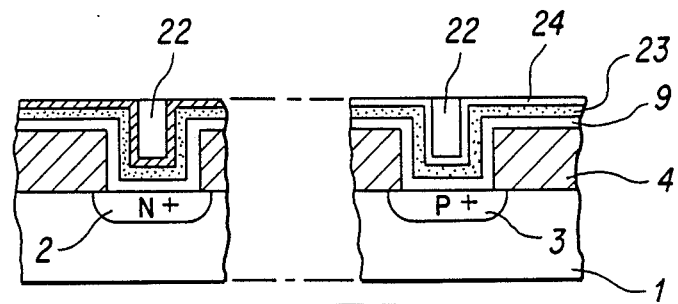
Figure 7C:
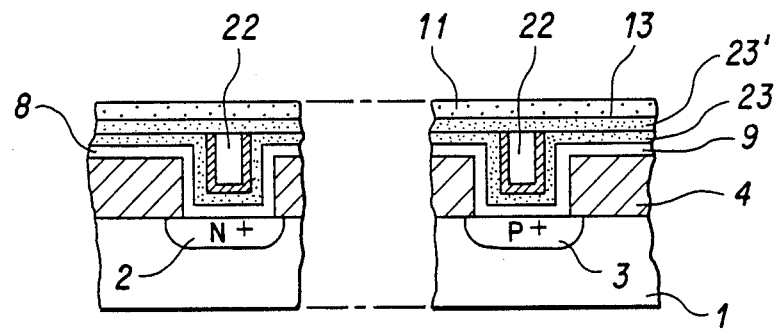

As shown in FIG. 7(a), the barrier metal layer 23 of approximately 500–1,000 Å thick, the thin SiO$_2$ layer 24 of approximately 500 Å and the thin polysilicon layer 22 are successively deposited by CVD over the entire surface of the substrate. The step coverage of these layers is very good, because they are deposited by CVD, and the thin polysilicon layer 22 buries the contact holes. Then, the polysilicon layer 22 is etched back as shown in FIG. 7(b). Dr etching is applicable for this purpose. Subsequently, as shown in FIG. 7(c), the etched surface of the substrate is covered with the barrier metal layer 23', over which the wiring layer 11 is formed. The latter step is similar to step 2(f) described with respect to FIG. 2.

Comparing the device of FIG. 7(c) to that of FIG. 6, the barrier layers 23 and 23' are added over the polysilicon layers 8 and 9. These layers do not merely provide the effect of preventing the migration of metal over the polysilicon, but they increase the conductivity of the layer for connection between the contact regions 2 or 3 and the wiring layer 11. Since the conductivity of the doped polysilicon is not so high, and its thickness is very thin, the barrier layer becomes a second conducting layer connecting the contact region and the wiring layer. Thus, the characteristics of the device are further improved.

Figure 8A:
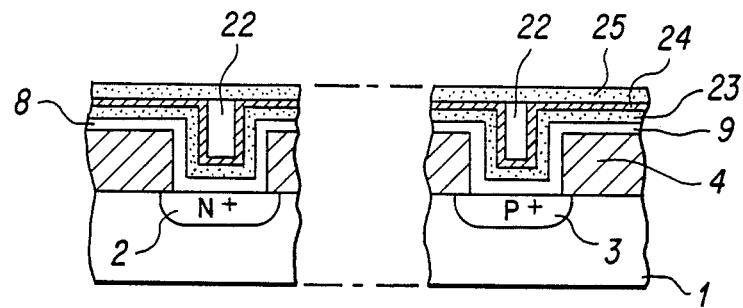
FIGS. 8(a) to 8(c) illustrate the fabrication steps for a variation of the third embodiment, to convert the metal barrier layer to a silicide barrier layer.

As a modification of the third embodiment, the metal barrier layer is converted to silicide by heat treatment. The fabrication process follows step 7(b) of FIG. 7. As shown in FIG. 8(a), second barrier metal layer 25 of approximately 1,000 Å is formed over the surface of the substrate. CVD or sputtering are applicable for this step.

Figure 8B:
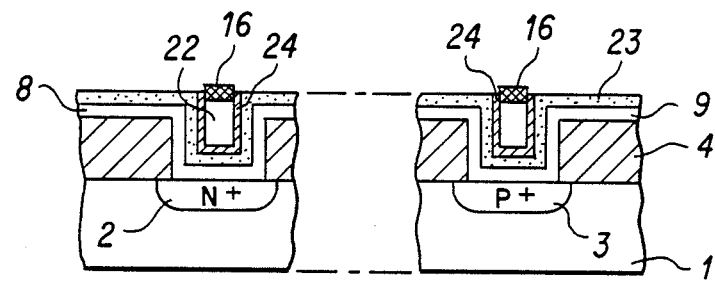

Next, the chip is annealed at a temperature of 600°–800° C. to convert the barrier metal to silicide. Thus, the second barrier metal layer 25 and polysilicon layer 22 burying the contact hole react to each other and form a silicide layer 16. As can be seen in FIG. 8(a), the reaction occurs only at a portion where the barrier metal contacts the silicon (polysilicon). Thus, the silicide layer 16 is formed only at the portion of the contact holes as shown in FIG. 8(b). Then the remaining second barrier metal layer 25 is selectively etched off. The etching is done by dry etching. When the etching is completed, the appearance becomes that shown in FIG. 8(b).

Figure 8C:
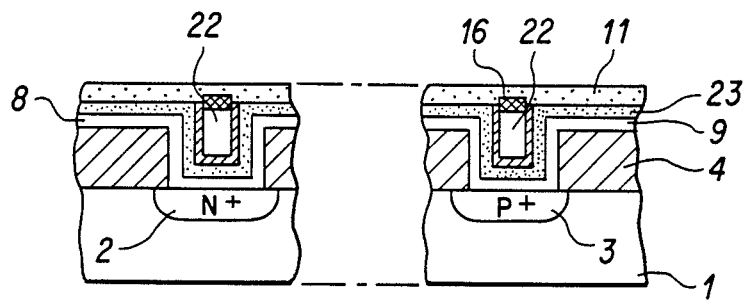

Then, the steps to form the wiring layer 11 are similar to those of FIG. 2(f). The cross section of the contact holes at the final state are as shown in FIG. 8(c). As can be seen in FIG. 8(c), and wiring layer, which is usually aluminum, does not directly contact the silicon (polysilicon), so the migration is avoided. The contact between the contact regions 2 or 3 and the wiring layer 10 is secured by a double layer of n or p type polysilicon layers 8 or 9 and the barrier metal layer 23. So the conductivity is further improved to that of FIG. 7(c).

Figure 3A:
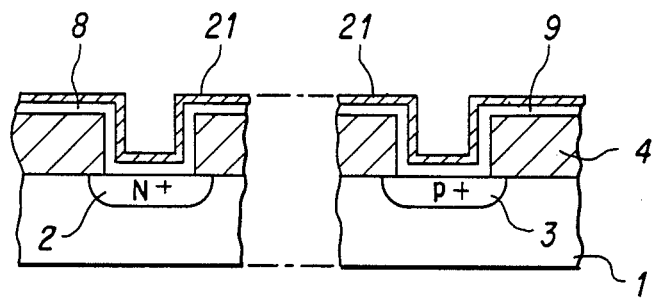
FIGS. 3(a) to 3(d) illustrate a first modification of the steps of the first embodiment, wherein a silicon dioxide film is added to cover the surface of the polysilicon films.
Figure 3B:
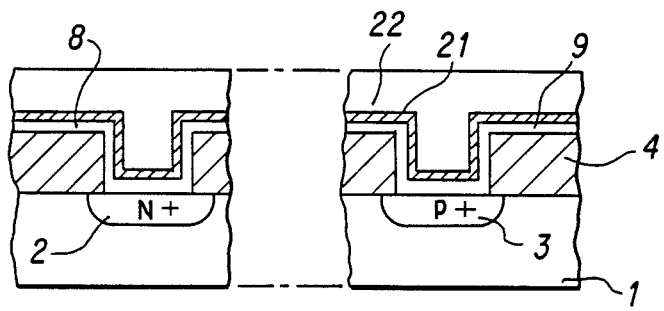
Figure 3C:
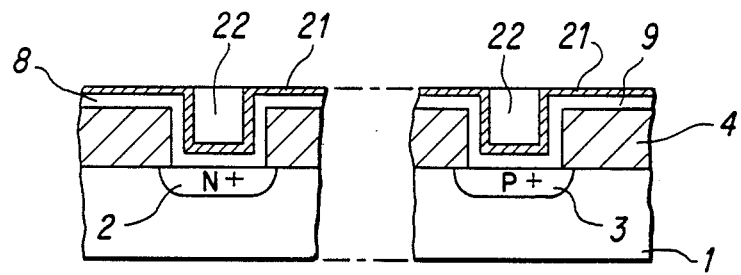
Figure 3D:
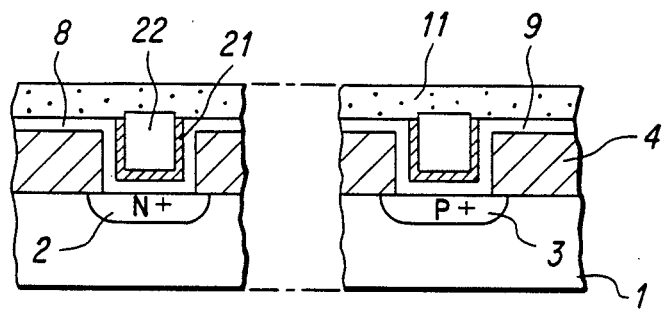

Modification of the third embodiment is also possible, it starts from the process step 3(c) described with respect to FIG. 3(c). The thin SiO$_2$ layer 21 is etched off. Then the entire surface is covered with a barrier metal layer (not shown), and the chip is annealed to convert the barrier metal layer to a silicide. In this case, the entire top surface of the chip is converted to the silicide and becomes the barrier layer. It will be understood by one skilled in the art that, when the wiring layer 11 is formed on this barrier layer, the device becomes similar to that shown in FIG. 6.

By the present invention, as has been described above, the contact holes formed in an insulation layer are coated on the inside with a conductive polysilicon layer having the same conductivity type as that of the contact regions of the device fabricated beneath the insulation layer. The step coverage of the polysilicon layer is very good because it is formed by chemical vapor deposition. Remaining portions of the contact holes are buried with a burying means which includes silicon dioxide. By doing so, the disconnection of the wiring layer is avoided and the reliability of the wiring is increased. Further, short circuits caused by the growth of spikes formed by eutectic of silicon and metal are also avoided.

The material comprising the burying means which buries the remaining portion of the contact holes may be SiO$_2$. It may be replaced by other materials such as polysilicon or amorphous silicon, but in order to do so, at least a layer of insulation film such as SiO$_2$ or Si$_3$N$_4$ is necessary to cover the surface of the conductive polysilicon layer.

The present invention further adds a barrier layer between the wiring layer and silicon (it may be polysilicon or amorphous silicon) to prevent the migration of metal (especially aluminum) over the silicon surface. This barrier layer becomes a second conductive layer to connect the wiring layer and the contact region of the device. This further increases the conduction between the contact area and the wiring layer.

The barrier layer is made from silicide of high melting point metal such as tungsten, molybdenum, titanium or platinum. But the barrier layer may be composed of a film of such high melting point metal. By using such material, the conductivity of the wiring layer is further increased. This increase in conductivity is important for a device operated at high speed or for decreasing heat generation of the chip.

In the above disclosure, the conductivity type of the substrate has been assumed to be n type, but it will be apparent that the invention may be applied to a substrate having any type of conductivity, and dimensions of the device described with respect to the embodiments are to be considered in all respects as illustrative and not restrictive.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

We claim:
1. A semiconductor device comprising:
   a semiconductor substrate;

an insulation layer covering the top surface of said substrate;

a wiring layer formed on said insulation layer;

a plurality of contact regions formed in the surface of said substrate for connection to said wiring layer;

a plurality of contact holes formed in said insulation layer, said wiring layer and said contact regions being connected through said contact holes, wherein said contact holes are formed respectively over each of said contact regions to expose said contact regions in the respective contact holes;

a conductive polysilicon layer formed on the side wall of each of said contact holes and the surface of said contact region exposed in each of said contact holes, one end of said conductive polysilicon layer contacting said wiring layer; and burying means for burying the remaining portion of each of said contact holes, each of said burying means comprising a silicon dioxide or silicon nitride film covering the inner surface of said conductive polysilicon layer, and a polysilicon layer which buries the remaining portion of said contact hole.

2. A semiconductor device comprising:

a semiconductor substrate;

an insulation layer covering the top surface of said substrate;

a wiring layer formed on said insulation layer;

a plurality of contact regions formed in the surface of said substrate for connection to said wiring layer;

a plurality of contact holes formed in said insulation layer, said wiring layer and said contact regions being connected through said contact holes, wherein said contact holes are formed respectively over each of said contact regions to expose said contact regions in the respective contact holes;

a conductive polysilicon layer formed on the side wall of each of said contact holes and the surface of said contact region exposed in each of said contact holes, one end of said conductive polysilicon layer contacting said wiring layer; and burying means for burying the remaining portion of each of said contact holes, each of said burying means comprising a silicon dioxide or silicon nitride film covering the inner surface of said conductive polysilicon layer, and an amorphous silicon layer which buries the remaining portion of said contact hole.

3. A semiconductor device according to claims 1 or 2, further comprising a barrier layer between said wiring layer and the top surface of the device fabricated therebeneath, said barrier layer being formed from a silicide of high melting point metal.

4. A semiconductor device according to claims 1 or 2, further comprising a barrier layer composed of a high melting point metal, said barrier layer being formed to cover the surface of the conductive polysilicon layer and the lower surface of said wiring layer.

5. A semiconductor device according to claim 4, wherein a portion of said barrier layer formed between said wiring layer and said burying means is a silicide of high melting point metal.

6. A semiconductor device according to claim 3, wherein said high melting point metal is selected from the group consisting of tungsten, molybdenum, titanium or platinum.

7. A semiconductor device according to claim 4, wherein said high melting point metal is selected from the group consisting of tungsten, molybdenum, titanium or platinum.

8. A semiconductor device according to claim 5, wherein said high melting point metal is selected from the group consisting of tungsten, molybdenum, titanium or platinum.

* * * * *

UNITED STATES PATENT AND TRADEMARK OFFICE
CERTIFICATE OF CORRECTION

PATENT NO. : 4,833,519

DATED : May 23, 1989

INVENTOR(S) : KAWANO et al

It is certified that error appears in the above-identified patent and that said Letters Patent is hereby corrected as shown below:

In the drawings, Sheet 7 of 8, FIG. 7A should appear as follows:

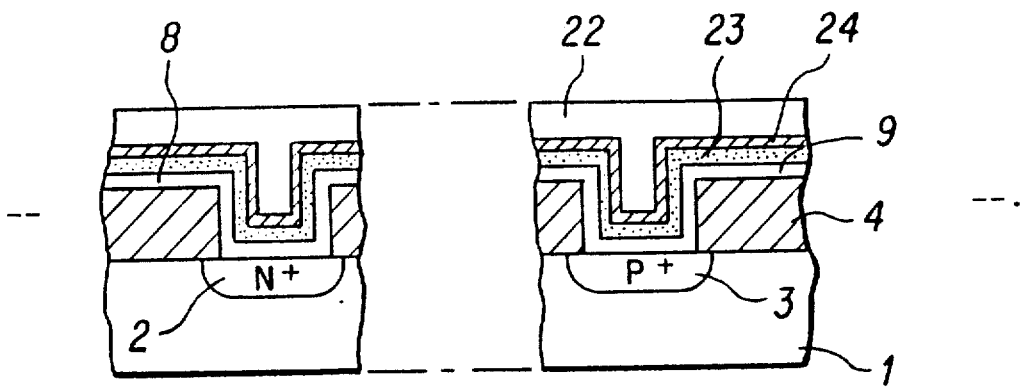

FIG. 7A

Signed and Sealed this

Twenty-sixth Day of November, 1991

Attest:

HARRY F. MANBECK, JR.

Attesting Officer

Commissioner of Patents and Trademarks